(12) United States Patent
Dorwarth et al.

(10) Patent No.: US 7,525,063 B2
(45) Date of Patent: Apr. 28, 2009

(54) METHOD FOR THE OPTICAL MARKING OF A TOUCH CONTACT SWITCH AND TOUCH CONTACT SWITCH

(75) Inventors: Ralf Dorwarth, Oberderdingen (DE); Wilfried Schilling, Oberderdingen (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 23 days.

(21) Appl. No.: 11/683,726

(22) Filed: Mar. 8, 2007

(65) Prior Publication Data

US 2007/0144874 A1 Jun. 28, 2007

Related U.S. Application Data

(63) Continuation of application No. PCT/EP2005/009715, filed on Sep. 9, 2005.

(30) Foreign Application Priority Data

Sep. 9, 2004 (DE) .................... 10 2004 044 355

(51) Int. Cl.
*H03K 17/975* (2006.01)

(52) U.S. Cl. ............... 200/600; 200/17 R; 345/168; 341/20; 324/716

(58) Field of Classification Search .......... 200/600, 200/5 R, 5 A, 17 R, 18; 345/168, 173–174; 341/20, 26, 30, 195; 324/716, 658, 662
See application file for complete search history.

(56) References Cited

U.S. PATENT DOCUMENTS

| 4,121,204 A | 10/1978 | Welch et al. |
| 4,897,493 A * | 1/1990 | Shaw et al. ............... 548/432 |
| 4,942,514 A | 7/1990 | Miyagaki et al. |
| 5,717,189 A * | 2/1998 | Goetz et al. ............... 219/483 |
| 5,917,165 A | 6/1999 | Platt et al. |
| 6,067,081 A | 5/2000 | Hahlganss et al. |
| 6,643,388 B1 * | 11/2003 | Yoo ........................... 382/124 |
| 6,734,377 B2 * | 5/2004 | Gremm et al. ............. 200/5 R |
| 7,180,017 B2 * | 2/2007 | Hein .......................... 200/5 R |
| 2004/0251402 A1 | 12/2004 | Reime |

FOREIGN PATENT DOCUMENTS

| DE | 3640371 A1 | 6/1988 |
| DE | 4033832 A1 | 6/1991 |
| EP | 859467 A1 | 8/1998 |
| EP | 0703525 B1 | 5/2001 |
| EP | 1253717 A2 | 10/2002 |

OTHER PUBLICATIONS

German Search Report corresponding to International Application No. 10 2004 044 355.6 dated Aug. 9, 2005.
International Search Report corresponding to International Application No. PCT/EP2005/009715 mailed Jan. 25, 2006.

* cited by examiner

*Primary Examiner*—Kyung Lee
(74) *Attorney, Agent, or Firm*—Alston & Bird LLP

(57) ABSTRACT

An elongate contact switch is disclosed having several partial contact areas and associated illumination means for indicating the actuation mode and also the actuation point to an operator, in order to increase operational effectiveness. The illumination means can be directly associated with individual partial contact areas or can indicate the progress of movements for operating the contact switch by applying a finger and pulling the same along a contact area. Moreover, malfunctions can be indicated to the operator.

18 Claims, 2 Drawing Sheets

METHOD FOR THE OPTICAL MARKING OF A TOUCH CONTACT SWITCH AND TOUCH CONTACT SWITCH

RELATED APPLICATIONS

This application is a continuation of international patent application PCT/EP2005/009715, filed on Sep. 9, 2005, which in turn claims priority from DE 102004044355.6, filed on Sep. 9, 2004.

FIELD OF APPLICATION

The invention relates to a method for the optical marking of a touch contact switch or its actuation state by an illumination means, as well as such a touch contact switch.

EP 859 467 A1 describes a capacitive touch contact switch placed under a glass ceramic hob for the operation thereof. The sensor surface of the contact switch is formed by an elastic plastic body, which is electrically conductive and which is applied to the underside of the glass ceramic hob. A central recess houses an illumination means, with which it is possible to mark the spot where the contact switch or sensor element is fitted, thus forming the spot to which a finger must be applied for actuation.

DE 102 51 639 A1 and DE 10 2004 038 872 describe touch contact switches, in which a sensor element or several sensor elements are directly placed on one another and are elongated in shape. Thus, it is for example possible for a functional unit of an electrical appliance, particularly a hotplate of a hob or cooktop, to set different power stages or levels, which can then be increased or decreased. It is also possible to carry out setting processes, such as preset times or preset weights or the like. Thus, by means of such a slider, not only are purely on/off switching processes initiated, but in particular, an adjustment of a value can be accomplished.

Such touch contact switches have different actuation states. Either they are not actuated or they are not. If an operator wishes to perform an actuation, he may place a finger on a corresponding contact surface. Either this takes place in a prescribed or correct manner, or not, so that if it is performed in the correct manner, it is clearly recognized as the desired, correct actuation. The corresponding function is initiated by a contact switch. If the actuation was incorrect or faulty, such as occurring on the edge of a corresponding contact surface or the like then although the contact switch records something, it is still not prescribed or correct. This is recognized and evaluated as incorrectly actuated and the corresponding function is not initiated by the touch contact switch.

The problem of the invention is to provide such a method and such a touch contact switch making it possible to obviate the prior art problems and in particular improve operating security by an easy, instinctively detectable recognition of an actuation state of the touch contact switch and therefore also an electrical appliance.

BRIEF DESCRIPTION OF THE DRAWINGS

Embodiments of the invention are diagrammatically illustrated by the drawings, wherein.

DETAILED DISCUSSION

Figure 1:
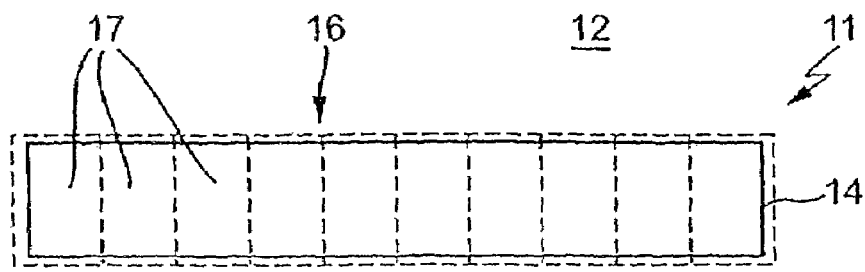
FIG. 1 illustrates according to one embodiment a plan view of a touch contact switch with a contact surface and a partial sensor element below the same.

This problem is solved in one embodiment by a method having the features of claim 1 and a touch contact switch having the features of claim 14. Advantageous and preferred developments of the invention are given in the remaining claims and are further explained hereinafter. By express reference the wording of the claims is made into part of the content of the description. Features describing the method and the contact switch are only described once hereinafter. However, quite independently of this, they apply both to the method and to the contact switch.

The contact switch has a contact surface for actuation, which is elongated and which can in particular be formed by one or more individual or partial contact sensors. The actuation states "not actuated", "incorrectly actuated" and "correctly actuated" exist for the contact switch. These can, for example, depend on whether a signal change is correct, expected, or strong enough. The illumination means can change their activation state or be activated or deactivated independently of the actuation state of the touch contact switch. In this way, not only is the point of the contact switch indicated for an operator, but also whether the contact switch can respond or is at present activated. It is also possible to activate the illumination means with an actuation of the contact switch, so that said actuation is outputted as an immediately detectable response or acknowledgement to an operator. It is possible to directly switch on the same, after having previously been switched off. Thus, the operator recognizes that the contact switch or the associated electrical appliance or a control has responded to the application of a finger or the actuation and that this is also in the prescribed form as "correctly actuated". At the end of the actuation with "not actuated", particularly if a finger is taken away from the contact surface again, the illumination means is switched off for corresponding information to an operator.

Instead of simply switching on and off the illumination means, it is also possible to change the light intensities or its color. It is also possible to change between continuous operation and flashing, or in the case of flashing, to change the frequencies. Thus, there are always numerous different ways of informing an operator of the actuation state through the state of activation of the illumination means. In certain circumstances it is also possible to generate acoustic signals. LEDs are particularly suitable as illumination means.

In a simple version it is also possible to activate and deactivate in the same way the illumination means, independently of the nature of the actuation. Thus, it is possible to only indicate the position of the contact switch.

A change in the state or operating mode of the illumination means can advantageously also depend on whether the actuation is admissible or intended or whether it is correctly actuated or incorrectly actuated. Thus, an operator recognizes if the actuation process was incorrect or has to be repeated.

It is also possible to subdivide the contact switch or contact sensor into different areas, i.e. partial areas or partial contact surfaces. Through such a subdivision of the contact switch, in which the partial areas directly connect onto one another, the aforementioned slider function can be implemented. A deactivation or activation of the illumination means is advantageously dependent on the position where a finger contacts the contact surface or over which partial area it is located. If different illumination means are directly associated with the partial areas, at least these can change state. The remaining illumination means can be left unchanged. It is alternatively possible to illuminate already passed or swept over partial areas in the manner of an advance bar, whereas partial areas which have not been passed or swept over are not illuminated.

According to a development of the invention, the illumination means are to be located within the surface of the partial areas and to this end can be provided with corresponding recesses. The partial areas or the areas of a contact sensor forming the same can be metallic or comprise a thin metal coating. Illumination means located below the recesses can emit or illuminate upwards through said recesses. The recesses can be distributed or form a through slot.

In another development of the invention the illumination means are also provided within the surface of the partial areas, but the said partial areas or the areas of the contact surface are constructed in electrically conductive and light-transmitting manner. Metal oxides, such as zinc oxide or the like can be used for such light-transmitting sensor surfaces in such a limited thickness that they are transparent or light-transmitting. It is also possible to use corresponding, electrically conductive and light-transmitting polymers.

Alternatively, the illumination means can be provided outside the partial areas, particularly on an outer boundary of the touch contact switch or contact surface. For this purpose, they can be provided on one or two longitudinal sides, so that they can indicate at what point of the contact surface a finger is located or contact is detected. Alternatively, the illumination means can frame the entire contact surface.

These and further features can be gathered from the claims, description and drawings and individual features, singly or in the form of subcombinations, and can be implemented in an embodiment of the invention and in other fields, and can represent advantageous, independently protectable constructions for which protection is claimed here. The subdivision of the application into individual sections and the subheadings in no way restrict the general validity of the statements made thereunder.

FIG. 1 is a plan view of a touch contact switch 11, which is provided on a surface or cover 12, for example a housing of an electrical appliance or a glass ceramic hotplate of an electric hob. Touch contact switch 11 is represented by a boundary 14, for example as an optical marking in the form of a rectangle printed in thin line form on the cover 12. Contact switch 11 is in particular constructed as a so-called slider, as described hereinbefore. This means that it can be contacted with a finger 26 at one point and actuation takes place by sliding the finger 26.

Contact switch 11 has sensor elements 16 formed by partial contact surfaces 17, which are relatively closely juxtaposed and makes it possible to determine a point of the actuation by a finger 26 applied to the surface of contact switch 11. The sensor elements can be formed by small metal surfaces, as well as by miscellaneous electrically conductive materials. They can also be in the form of separate components or form a common assembly. They can also be constructed in full-surface and simultaneously light-transmitting manner.

Figure 2:
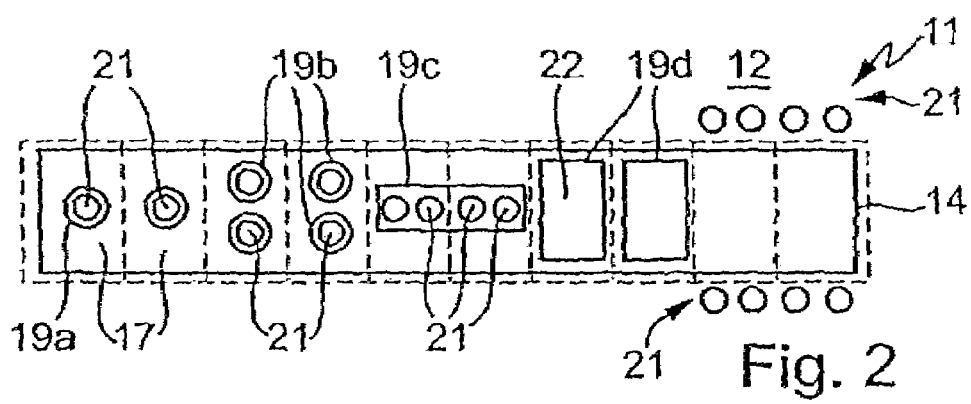
FIG. 2 illustrates different embodiments of providing illumination means in a contact switch according to FIG. 1.

FIG. 2 shows that recesses 19 in different forms are provided in the partial contact surfaces 17. To the far left is provided a circular recess 19a positioned in the centre of the corresponding partial contact surface 17.

Somewhat to the right thereof, two recesses 19b are superimposed within a partial contact surface 17. Yet further to the right, is a slot-like recess 19c, which passes through the partial contact surfaces 17. To the right and alongside the same there are relatively large recesses 19d. It is advantageous here if the surfaces of the recesses 19d are either covered with a transparent, electrically conductive coating or, for example, with a fine, conductive grid or the like.

In the case of the partial contact surface 17 to the far right on contact switch 11, no recesses are provided. Here the LEDs 21 are positioned above and below the partial contact surface 17 and further details will be given thereon hereinafter.

In each case circular LEDs 21 are provided as illumination means in recesses 19a to 19c. In particular, they substantially entirely fill the recesses 19 or form a very flat illumination. In addition, the recesses 19d can contain so-called illuminating surfaces 22 or similar flat illumination elements. These can also be LED components, but which contain several LEDs in a housing or in some other way represent a relatively large-area illumination.

The different representations of recesses 19 and illumination means 21, 22 in FIG. 2 are of an exemplified nature and are to be provided on the entire contact switch 11 in one of the constructions shown. Thus, a unitary image is provided for an operator and the contact switch 11 can be particularly easily and safely operated, particularly with regards to its functionality and response. Particularly through LEDs or other illumination means positioned outside the contact switch 11, it is also possible to represent fault states of the actuation of contact switch 11 and this will be explained in greater detail hereinafter.

Figure 3:
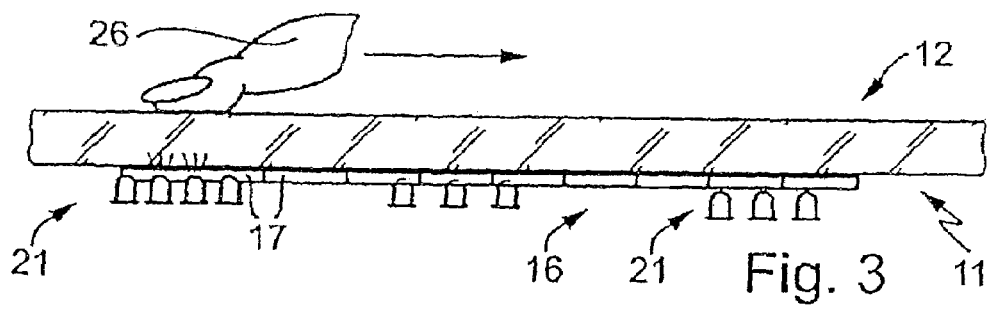
FIG. 3 illustrates one embodiment of a side view of the contact switch according to FIG. 2.

In the side view of FIG. 3 it is possible to establish how the sensor elements 16 or partial contact surfaces 17 engage on the underside of a cover 12, for example as a glass ceramic plate. LEDs 21, or other illumination means, are either provided on the edge outside or below the same. Alternatively they can project into corresponding recesses 19. Instead of the aforementioned recesses 19, it is also possible to give a light-transmitting construction to the partial contact surfaces, for example through light-transmitting metal oxide coatings, particularly of zinc oxide or also light-transmitting, electrically conductive polymers. In this case the illumination means can be placed below the partial contact surfaces and is particularly appropriate for recesses 19d.

Touch contact switch 11 is constructed as a capacitive contact switch. With regards to the operation reference is made to the aforementioned DE 102 51 639 A1 and DE 10 2004 038 872, whose content is hereby expressly made into part of the content of the present description.

FUNCTION

Figure 4:
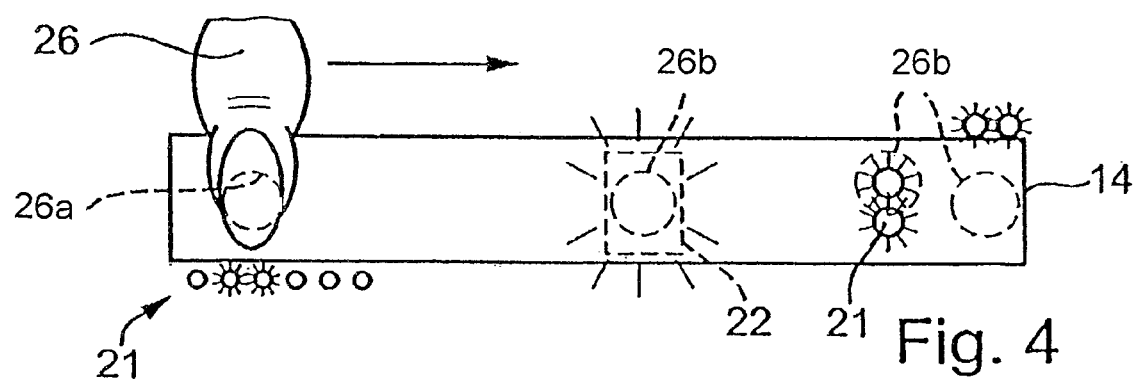
FIG. 4 illustrates different operating states of the contact switch indicated by different illumination means.

FIG. 4 illustrates how a finger 26 is used for operating contact switch 11, which is also represented in simplified form by the broken line circles 26a in the starting position and 26b in an intermediate or end position. As soon as it is applied in the prescribed manner to contact switch 11 in the form of a correct actuation, it is possible to activate the LEDs 21 or corresponding illumination means. This can take place in such a way that an illumination occurs around contact switch 11, virtually as a frame outside or at boundary 14. It is in this way indicated to an operator that following the correct application of the finger 26 the touch contact switch is activated and that application has correctly taken place. The finger 26 can now be moved and in particular drawn to the right in the applied state. This is illustrated by the motion arrow. In the central position of finger 26b shown, it is possible to illuminate the entire partial contact surface 17 corresponding to position 26b. Such a position-bound illumination can be carried out independently or alternatively to a frame-like illumination of the entire contact switch. Each of the positions 26b on contact switch 11 or contact surface 12 is precisely associated with a partial contact surface 17 and correspondingly illuminates the same.

Instead of an illumination of the entire partial contact surface 17 it is also possible for individual LEDs 21 to precisely indicate this position inside or outside boundary 14. Illumination means or LEDs 21 to the left thereof can either also illuminate and in certain circumstances also more weakly or flash in order to illustrate the path covered up to then. Alternatively an indicative illumination only takes place at the point of actuation 26b.

Illustrated to the far right in FIG. 4 is shown how the position of an actuation 26b is indicated by LEDs 21 located outside boundary 14.

Figure 5:
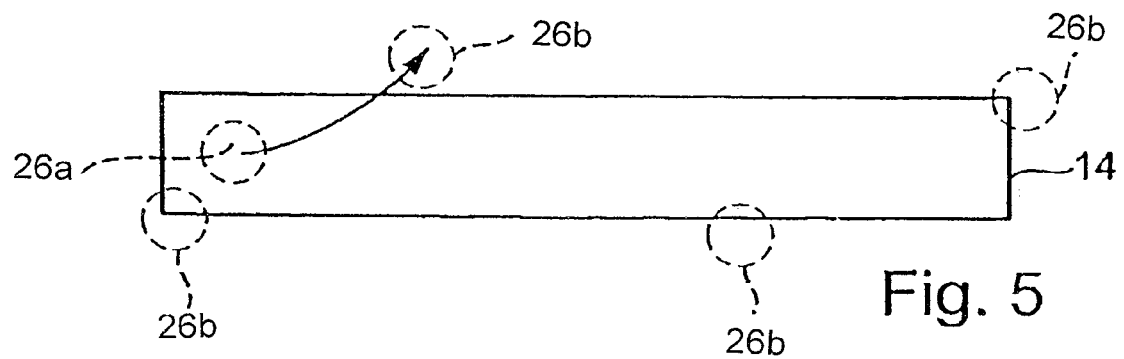
FIG. 5 illustrates different operating states of a contact switch indicated by FIG. 2, in which the illumination means are deactivated through non-prescribed actuation.

FIG. 5 shows different actuation states or positions of the finger 26, which are not prescribed or are incorrect. Thus, for example starting from an initial contact position 26a to the far left, essentially corresponding to that of FIG. 4, the finger 26 is moved to the right and at the same time outside boundary 14. Whereas initially an illumination of the contact switch was indicated, the illumination is deactivated at the latest in the represented position of the finger 26b, because there a faulty actuation exists. This is illustrated in FIG. 5 in that no illuminating or emitting LEDs 21 or other illumination means are shown.

Further incorrect positions 26b of a finger are shown to the far right and right bottom on contact switch 11. Here the surface of finger 26b projects by more than half over the boundary 14 towards the outside, which is recognized and evaluated as incorrect by the partial contact surfaces 17 or contact switch 11. Through the deactivation of illumination means 21, it is indicated to an operator that he has placed the finger 26 outside the boundary 14 of contact switch 11 or that an incorrect operation exists.

Alternatively such an incorrect operation can be shown by the flashing of already illuminating illumination means, which can instinctively be recognized as a fault or faulty state. There can also be a colour change, for example, indicating a red color in the case of a faulty operation, so that faulty operation is also indicated in a clear manner. In addition, faulty operation can also be indicated by acoustic signal generators or the like.

Within the scope of the invention it is also possible to conceive further mixed possibilities with respect to what has been described hereinbefore and whose details are not listed here.

One aspect of the invention is that a touch contact switch, particularly of an elongated nature and with several partial contact surfaces, has associated illumination means, in order to indicate to an operator the actuation state and advantageously also the actuation point. It is particularly advantageous if the illumination means are directly associated with individual partial contact surfaces or the movement advance for an operation of the contact switch by applying a finger and drawing the same along a contact surface can be indicated in roughly positionally correct manner. It is also possible to indicate incorrect actuations, if an incorrect actuation has taken place.

The invention claimed is:

1. A method for optically marking a touch contact switch under a cover by using a plurality of illumination sources, wherein said touch contact switch has defined actuation states comprising "not actuated", "incorrectly actuated" and "correctly actuated",
wherein at least a subset of said plurality of illumination sources are activated if the touch contact switch is in said "correctly actuated" state,
wherein said subset of said plurality of illumination sources are deactivated if the touch contact switch transition is in said "not actuated" state and wherein further said subset of said plurality of illumination sources are deactivated with the removal of a user's function contacting a partial contact surface of said cover, and
wherein at least said subset of said plurality of illumination sources change their illumination state when the touch contact switch is in said "incorrectly actuated" state.

2. The method according to claim 1, wherein transition of the touch contact switch from said on-state to said off-state and transition of the contact switch from said off-state to said on-state is accomplished with the same user input.

3. The method according to claim 1, wherein said touch contact switch is subdivided into a plurality of partial contact surfaces.

4. The method according to claim 1, wherein different functions are initiated when a user touches different touch contact positions on said cover of said touch contact switch, wherein activating or deactivating said subset of said plurality of illumination sources or determining an actuation state is dependent on a touch contact position on said partial contact surface by said user's finger.

5. The method according to claim 3, wherein each one of said plurality of partial contact surfaces is associated with a respective subset of said plurality of illumination sources and contacting one of said plurality of partial contact surfaces results in a respective one of said subset of said plurality of illumination sources to be activate or deactivated.

6. The method according to claim 1, wherein said plurality of illumination sources are constructed for being activated with different activation states.

7. The method according to claim 6, wherein said plurality of illumination sources are constructed for being activated with different light intensities.

8. The method according to claim 6, wherein said plurality of illumination sources are constructed to flash on and off.

9. The method according to claim 1, wherein said touch contact switch has a plurality of partial contact surfaces on said cover, wherein a point on said cover touched by a user's finger results in a respective subset of said plurality of illumination sources to be activated.

10. A touch contact switch comprising:
a plurality of contact surfaces on a surface cover configured to detect a touch of a user's finger at a point on one of said plurality of contact surfaces, wherein said touch contact switch has defined actuation states comprising "not actuated", "incorrectly actuated," and "correctly actuated"; and
a plurality of illumination sources comprising a plurality of subsets of illumination sources, wherein at least one or more subsets of said illumination sources are configured to change activation state as a function of a transition of said touch contact switch from a first actuation state to a second actuation state.

11. The touch contact switch according to claim 10, wherein said plurality of partial contact surfaces are juxtaposed, wherein each one of said plurality of partial contact surfaces is individually capable of detecting said touch of said user's finger so as to transition the touch contact switch from said first state to said second state, wherein further each one of said plurality of partial contact surfaces is respectively associated with one of said plurality of subsets of illumination sources, and wherein said one of said subsets of illumination sources is separately activatable and deactivatable as a function of said one of said subsets of said plurality of illumination sources' actuation state or on actuation emit a differentiatable signal.

12. The touch contact switch according to claim 11, wherein said plurality of illumination sources are provided underneath said surface cover and said plurality of partial contact surfaces comprise electrically conductive sensor surfaces having an opening for said plurality of illumination sources for radiating light through said surface.

13. The touch contact switch according to claim 12, comprising a plurality of adjacent recesses.

14. The touch contact switch according to claim 13, wherein said recesses are constructed as a longitudinal slot.

15. The touch contact switch according to claim 10, wherein said plurality of partial contact surfaces are juxtaposed and configured for emitting a differentiatable signal on actuation, wherein each one of said plurality of partial contact surfaces is associated with one of said plurality of subsets of said illumination sources, capable of separate activation and deactivation as a function of the actuation state of said one of said plurality of subsets of said illumination sources.

16. The touch contact switch according to claim 10, wherein said plurality of illumination sources forms a frame around said contact surface.

17. The touch contact switch according to claim 10, wherein said plurality of illumination sources comprise LEDs.

18. A touch contact switch comprising:
a cover comprising indicia for indicating a boundary thereby defining an area within said boundary, wherein said cover can be touched by a user's finger;
a plurality of contact surfaces aligned in an adjacent manner below said cover configured to detect a touch of said user's finger at a touch location point on said cover, wherein said touch contact switch is configured to evaluate said touch location point as "not actuated", "incorrectly actuated", and "correctly actuated";
wherein if said touch location point is within said area within said boundary, said touch contact switch evaluates said touch location point as "not actuated" or "correctly actuated", and
wherein if said touch location point is outside said area, said touch contact switch evaluates said location point as "incorrectly actuated"; and
a plurality of illumination sources comprising a plurality of subsets of illumination sources,
wherein each one of the plurality of subsets of illumination sources are each respectively associated with a one of the plurality of contact surfaces,
wherein at least one or more subsets of illumination sources are configured to change activation state as a function of the evaluation of said location points as "not actuated", "incorrectly actuated", and "correctly actuated".

* * * * *

UNITED STATES PATENT AND TRADEMARK OFFICE
CERTIFICATE OF CORRECTION

PATENT NO. : 7,525,063 B2
APPLICATION NO. : 11/683726
DATED : April 28, 2009
INVENTOR(S) : Dorwarth et al.

It is certified that error appears in the above-identified patent and that said Letters Patent is hereby corrected as shown below:

Column 2,
Line 21, "of" should read --or--.

Column 8,
Line 25, "points" should read --point--.

Signed and Sealed this

Eighteenth Day of August, 2009

David J. Kappos
*Director of the United States Patent and Trademark Office*